Figure 2A:
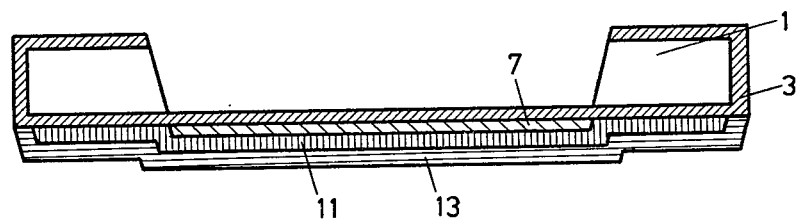

United States Patent [19]

Harms et al.

[11] Patent Number: 4,468,799
[45] Date of Patent: Aug. 28, 1984

[54] RADIATION LITHOGRAPHY MASK AND METHOD OF MANUFACTURING SAME

[75] Inventors: Margret Harms, Hamburg; Holger Lüthje, Halstenbek; Bernd Matthiessen, Hamburg, all of Fed. Rep. of Germany

[73] Assignee: U.S. Philips Corporation, New York, N.Y.

[21] Appl. No.: 372,886

[22] Filed: Apr. 29, 1982

[30] Foreign Application Priority Data

May 18, 1981 [DE] Fed. Rep. of Germany ....... 3119682

[51] Int. Cl.³ .............................................. B01J 17/00
[52] U.S. Cl. ......................................... 378/35; 430/5
[58] Field of Search ............... 250/505; 378/35; 430/5

[56] References Cited

U.S. PATENT DOCUMENTS

| | | | |
|---|---|---|---|
| 3,742,230 | 6/1973 | Spears et al. | 378/35 |
| 4,035,522 | 7/1977 | Hatzakis | 378/35 |
| 4,037,111 | 7/1977 | Coquin et al. | 378/35 |
| 4,171,489 | 10/1979 | Adams et al. | 378/35 |
| 4,218,503 | 8/1980 | Reekstin et al. | 378/35 |
| 4,253,029 | 2/1981 | Lepselter et al. | 378/35 |
| 4,283,632 | 8/1981 | Nakagawa et al. | 250/505.1 |
| 4,329,410 | 5/1982 | Buckley | 430/5 |

*Primary Examiner*—Bruce C. Anderson
*Attorney, Agent, or Firm*—Paul R. Miller

[57] ABSTRACT

The manufacture of semiconductor systems by means of radiation lithography requires low-stress masks when it is important to achieve very fine structures. In accordance with the invention, such a mask comprises a carrier of boron-doped silicon, a radiation absorbing pattern consisting of a double layer of different metals, such as molybdenum and tungsten, or a double layer of layers of the same metal, such as molybdenum, which are deposited in a different manner.

4 Claims, 7 Drawing Figures

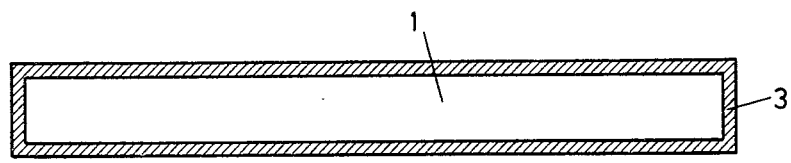
FIG.1a
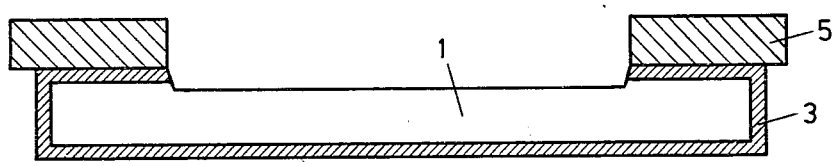
FIG.1b
FIG.1c
FIG.1d
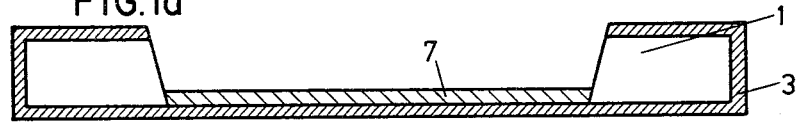
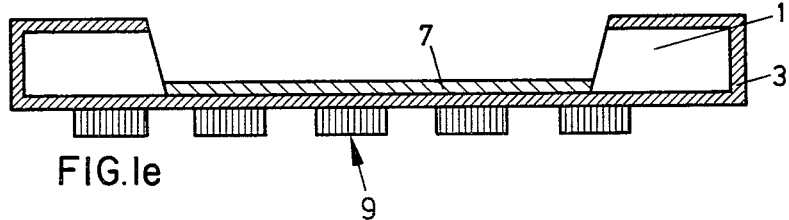
FIG.1e

RADIATION LITHOGRAPHY MASK AND METHOD OF MANUFACTURING SAME

The invention relates to a radiation lithography mask, comprising a silicon carrier having a major surface which is locally provided with a radiation absorbing layer. The invention also relates to a method of manufacturing such a mask.

A mask of this kind can be used, for example, for lithographic processes for the manufacture of semiconductor systems having structure dimensions in the micrometer range where a photoresist is exposed to X-rays. Structures having dimensions of approximately 150 nm can thus be formed. The use of X-rays for the exposure of a resist to be structured offers the advantage that the effect of diffraction phenomena during the projection of the masking structures on the resist is much smaller than when visible light is used.

A mask of this kind is known from DE-AS No. 23.02.116 in which the radiation absorbing layer is a layer of gold.

The known mask is very well suitable for given applications. However, it has been found that as the structures formed are finer, mechanical stresses occurring in the carrier and the radiation absorbing layer cause deformation of the mask. Due to these deformations, radiation lithography masks of the described kind have been found to be inadequate for applications where a high resolution in the sense of a high degree of fineness of the pattern is pursued.

It is an object of the invention to provide a mask of the kind set forth whereby structures with a high degree of fineness can be made.

To this end, a mask of the kind set forth in accordance with the invention is characterized in that the radiation absorbing layer is an internally stress-compensated double layer. Deformation of the mask is thus strongly counteracted while, moreover, the radiation absorption of the portions of the carrier which are not covered by the radiation absorbing layer is not influenced, so that the mask exhibits an as high as possible contrast.

A preferred embodiment of the mask in accordance with the invention is characterized in that the double layer consists of layers of different metals. These metals are preferably tungsten and molybdenum, the tungsten layer being deposited by cathode sputtering under the following circumstances: RF generator: 13.6 MHz; diameter of the electrodes: 200 mm; distance between the electrodes: 42 mm; operating pressure of the gas atmosphere: $Ar=2$ Pa; potential on the electrode: 800 V; potential on the mask carrier: 40 V; the molybdenum layer is deposited by cathode sputtering under the following circumstances: RF-generator: 13.6 MHz; diameter of the electrodes: 200 mm; distance between the electrodes: 42 mm; operating pressure of the gas atmosphere: $Ar=2$ Pa; potential on the electrode: 700 V; potential on the mask carrier: 95 V.

The choice of these metals for the double layer offers the following advantages: the tungsten as well as the molybdenum adhere very well to the silicon mask carrier, so that it is not necessary to provide an adhesive intermediate layer between the mask carrier and the radiation absorbing layer. The parameters chosen for the cathode sputtering process for the deposition of the tungsten as well as the molybdenum layer offer the advantage that the double layer exhibits only minimum mechanical stresses, because the compressive stress still present in the tungsten layer is compensated for by a tensile stress present in the molybdenum layer, so that overall a substantially stress-free radiation absorbing double layer is obtained.

The sequence of deposition of the molybdenum layer and the tungsten layer on the mask carrier is arbitrary.

The use of these two metals for the double layer offers an additional advantage in that both metals form volatile etching products when etched by means of reactive ions; this is advantageous because structures comprising steep etching edges which are desirable for masking purposes are thus obtained.

A further preferred embodiment of the mask in accordance with the invention is characterized in that the double layer consists of layers of one and the same metal deposited in a different manner. The metal is preferably molybdenum. The first half of the molybdenum layer is deposited under the following circumstances: RF-generator: 13.6 MHz; diameter of the electrodes: 200 mm; distance between the electrodes: 42 mm; operating pressure of the gas atmosphere: $Ar=2$ Pa; potential on the cathode: 700 V; potential on the mask carrier; 65 V; the second half of the desirable thickness of the molybdenum layer is deposited under the following circumstances: RF-generator: 13.6 MHz; diameter of the electrodes: 200 mm; distance between the electrodes: 42 mm; operating pressure of the gas atmosphere: $Ar=2$ Pa; potential on the cathode: 800 V; potential on the mask carrier: ground. This choice of the parameters for the cathode sputtering process results in very low stresses in the molybdenum layer.

For a further reduction of the stresses occurring in the mask, a further preferred embodiment of the mask in accordance with the invention is also characterized in that a stress-compensating layer which is substantially transparent for radiation is provided on at least one of the major surfaces of the carrier. The radiation transmitting layer is preferably made of titanium which is deposited by cathode sputtering under the following circumstances: RF-generator: 13.6 MHz; diameter of the electrodes: 200 mm; distance between the electrodes: 42 mm; operating pressure of the gas atmosphere: $Ar=0.78$ Pa; potential on the cathode: 900 V; potential on the mask carrier: grounded; this layer is alternatively a layer of titanium dioxide which is deposited under the following circumstances: RF-generator: 13.6 MHz; diameter of the electrodes: 200 mm; distance between the electrodes: 42 mm; operating pressure of the gas atmosphere: $O_2=1.3$ Pa; potential on the cathode: 750 V; potential on the mask carrier: grounded.

The invention also relates to a method of manufacturing a radiation lithography mask, comprising a silicon carrier having a major surface which is locally provided with a radiation absorbing layer, the basic material being a silicon wafer. The method in accordance with the invention is characterized in that the silicon wafer is provided with a boron-doped layer which adjoins the entire surface thereof, after which a portion of this layer which adjoins one of the major surfaces of the silicon wafer and the silicon which is situated therebelow are removed as far as the boron-doped layer adjoining the other major surface, thus a thin carrier of boron-doped silicon being formed on which ultimately the radiation absorbing layer is deposited.

A low-stress mask carrier is thus simply formed.

Figure 2B:
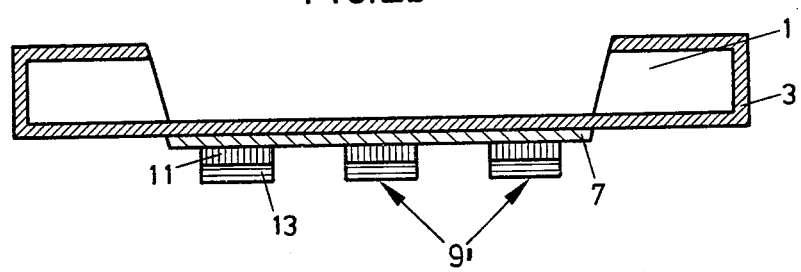

The invention will be described in detail hereinafter, by way of example, with reference to the accompanying drawing. Therein:

FIGS. 1a to 1e show successive stages of the manufacture of a first preferred embodiment of the mask in accordance with the invention, and FIGS. 2a and 2b show a further preferred embodiment of the mask in accordance with the invention.

FIG. 1a shows a monocrystalline silicon wafer 1 which is provided with a boron diffusion layer 3 in the entire region situated near the surface. It is not necessary to subject the silicon wafer 1 to an allower polishing treatment prior to the boron doping.

For the boron doping, for example, a commercially available monocrystalline silicon wafer having, for example, a diameter of 75 mm, a <100>-orientation and a thickness of, for example, 0.4 mm, is first precleaned for five minutes in fuming nitric acid ($HNO_3$), followed by cleaning for 10 minutes in boiling nitric acid ($HNO_3$). For the all over boron diffusion, the silicon wafers 1 thus prepared are treated as follows: First a boron deposit is formed on the silicon wafers by (a) heating the silicon wafers to 870° C. in an $N_2/O_2$ atmosphere in a first furnace in which boron nitride plates and silicon wafers being alternately arranged;

(b) increasing the temperature of the furnace to 970° C. at a rate of 9° C./min. in an $N_2/O_2$ atmosphere;

(c) exposing the silicon wafers to an $N_2/O_2$ atmosphere for 3 minutes;

(d) exposing the silicon wafers to an $N_2/O_2/H_2$ atmosphere for 1 minute;

(e) exposing the silicon wafers to a pure $N_2$ atmosphere for 40 minutes;

(f) cooling the silicon wafers to 870° C. in a pure $N_2$ atmosphere at a rate of 4° C./min. Subsequently, the boron is diffused in the silicon wafers by:

(a) heating the silicon wafers again to 900° C. in an $N_2/O_2$ atmosphere in a second furnace, notably a diffusion furnace;

(b) heating the silicon wafers to 1200° C. in an $N_2/O_2$ atmosphere at a rate of 9° C./min.;

(c) exposing the silicon wafers to an $N_2/O_2$ atmosphere for 30 minutes;

(d) cooling the silicon wafers to 900° C. in an $N_2/O_2$ atmosphere at a rate of 3° C./min.

For the $N_2/O_2$ atmosphere, use is made of, for example, a circulating atmosphere with 5 l/min.$N_2$ gas and 100 ml/min.$O_2$ gas.

A boron diffusion layer thus formed exhibited a specific surface resistance of 1.4–1.5 ohms, a doping of approximately $1.5 \cdot 10^{20}$ atoms per cc, and a thickness of approximately 4 $\mu$m.

A part of the boron diffusion layer 3 is removed by etching by means of reactive ions. For masking the regions of the boron diffusion layer 3 on one of the major surfaces of the silicon wafer 1 which are not to be removed, use is made of, for example, a mechanically provided mask 5 of, for example, aluminium, high-grade steel, silicon or glass with a thickness of from 0.3 to 1.0 mm (see FIG. 1b). In the region which is not masked by the mask 5, the boron diffusion layer 3 can be advantageously removed by etching by means of ions in a $SF_4/O_2$ plasma or an $SF_6/O_2$ plasma in which the $O_2$ amounts to approximately 10%. The etching process is performed, for example, under the following circumstances: RF-generator: 27.2 MHz; diameter of the electrodes: 150 mm; potential on the cathode: 500 V; operating pressure of the gas atmosphere: $SF_6$ or $CF_4 = 0.5$ Pa; $O_2 = 0.5$ Pa; material of the cathode: $SiO_2$. Under these circumstances, the etching rate R for boron-doped silicon with a doping concentration of $>10^{20}$ at/cm$^3$ is 6 $\mu$m/hour in $CF_4/O_2$ and 30 $\mu$m/hour in $SF_6/O_2$.

The silicon wafer 1 thus exposed at the area of the opening of the mask 5 is treated in a further etching step in which the part of the silicon wafer 1 which is not doped with boron is removed by chemical wet etching. The remaining boron diffusion layer 3 (according to FIG. 1c) serves as the etching mask. The chemical wet etching process is performed by means of a mixture of ethyldiamine:pyrocatechol:water=5:1:2.5 as the etching solution; etching takes place at a temperature of 110° C. However, use can alternatively be made of a mixture of 300 g KOH + 2 g $K_2Cr_2O_7$ + 1200 ml $H_2O$ at a temperature of 81° C.

Subsequently on the thin carrier 3 of boron-doped silicon thus formed a radiation absorbing single layer of molybdenum is deposited on the major surface which is situated opposite the window with the layer 7 by means of known techniques, for example, vapour deposition or cathode sputtering. The structuring of this radiation absorbing layer is realized in accordance with the desired mask pattern by means of known techniques, for example, by means of electron beam lithography. FIG. 1e shows such a radiation absorbing mask structure 9 which consists of this single layer. The thickness of the molybdenum layer used to form the structure 9 amounts to 0.8 $\mu$m in the described embodiment. The thickness of the radiation absorbing layer 9 is dependent on the thickness of the carrier 3 in order to obtain a usable contrast ratio of the mask carrier and the radiation absorbing layer. In order to obtain a low-stress molybdenum layer, the procedure is as follows: the first half of the desirable thickness of the molybdenum layer is deposited under the following circumstances: RF-generator: 13.6 MHz; diameter of the electrodes: 200 mm; distance between the electrodes: 42 mm; operating pressure of the gas atmosphere: Ar=2 Pa; potential on the cathode: 700 V; potential on the mask carrier: 65 V; the second half of the desirable thickness is deposited under the following circumstances: RF-generator: 13.6 MHz; diameter of the electrodes: 200 mm; distance between the electrodes: 42 mm; operating pressure of the gas atmosphere: Ar=2 Pa; potential on the cathode: 800 V; potential on the mask carrier: grounded.

The radiation absorbing layer in FIG. 2a is a multiple layer structure which consists of a tungsten layer 11 and a molybdenum layer 13 deposited on the carrier 3. The tungsten layer 11 as well as the molybdenum layer 13 are effectively deposited directly on the boron diffusion layer 3 or on the stress-compensating layer 7 by cathode sputtering. The cathode sputtering process for the tungsten layer 11 is performed, for example, under the following circumstances:
RF-generator: 13. 6 MHz; diameter of the electrodes: 200 mm; potential on the cathode: 800 V; potential on the mask carrier: 40 V; operating pressure of the gas atmosphere: Ar=2 Pa; distance between the electrodes: 42 mm.

The cathode sputtering process for the molybdenum layer 13 is performed, for example, under the following circumstances:
RF-generator: 13. 6 MHz; diameter of the electrodes: 200 mm; potential on the cathode: 700 V; potential on the mask carrier: 95 V; operating pressure of the gas atmosphere: Ar=2 Pa; distance between the electrodes: 42 mm.

FIG. 2b shows a mask structure 9' formed from the multiple layer consisting of the molybdenum layer 11 and the tungsten layer 13. The structuring of the radiation abosrbing multiple layer is performed in accordance with the desired mask pattern by means of known techniques, for example, by means of electron beam lithography.

In order to obtain a particularly low-stress mask, on the carrier 3 there is also provided a stress compensating, radiation transmitting layer 7 by means of known techniques, for example, vapour deposition or cathode sputtering (see FIG. 1d). The layer 7 consists of titanium or titanium dioxide in the present embodiment. The titanium dioxide layer can be attractively formed by reactive cathode sputtering in a oxygen plasma under the following circumstances:

RF-generator: 13.6 MHz; diameter of the electrodes: 200 mm; potential on the cathode: 750 V; potential on the mask carrier: grounded; operating pressure of the gas atmosphere: $O_2 = 1.3$ Pa; distance between the electrodes: 42 mm.

Equally suitable as the described titanium dioxide layer, however, is a titanium layer deposited by cathode sputtering in an inert atmosphere under the following circumstances:

RF-generator: 13.6 MHz; diameter of the electrodes: 200 mm; potential on the cathode: 900 V; potential on the mask carrier: grounded; operating pressure of the gas atmosphere: $Ar = 0.78$ Pa; distance between the electrodes: 42 mm. As is shown in FIG. 1, the layer 7 may be provided on the side of the carrier 3 which is situated opposite the radiation absorbing layer. However, it may alternatively be provided on the same side as shown in FIG. 2.

What is claimed is:

1. A radiation lithography mask comprising:
    a silicon carrier structure having an opening therethrough,
    a boron-silicon layer overlying said silicon carrier and covering said opening at a major surface of said carrier, and
    a radiation absorbing layer provided at said major surface over said boron-silicon layer,
    wherein said radiation absorbing layer is an internally stress-compensated double layer of two different metals, and
    wherein a further stress-compensating layer of titanium or titanium oxide is provided on at least one side of said boron-silicon layer, said further layer being substantially transparent to radiation.

2. A radiation lithography mask according to claim 1, wherein said two different metals are tungsten and molybdenum.

3. A radiation lithography mask comprising:
    a silicon carrier structure having an opening therethrough,
    a boron-silicon layer overlying said silicon carrier and covering said opening at a major surface of said carrier, and
    a radiation absorbing layer provided at said major surface over said boron-silicon layer,
    wherein said radiation absorbing layer is an internally stress-compensated double layer of molybdenum, each of said molybdenum layers applied in a different manner, and
    wherein a further stress-compensating layer of titanium or titanium oxide is provided on at least one side of said boron-silicon layer, said further layer being substantially transparent to radiation.

4. A radiation lithography mask according to claim 3, wherein each of said molybdenum layers is applied by cathode sputtering with a variation of cathode voltage and carrier voltage for each different molybdenum layer.

* * * * *